United States Patent [19]

Hinze

[11] Patent Number: 5,703,754
[45] Date of Patent: Dec. 30, 1997

[54] FASTENERLESS SEALED ELECTRONIC MODULE

[75] Inventor: Lee R. Hinze, Kokomo, Ind.

[73] Assignee: Delco Electronics Corporation, Kokomo, Ind.

[21] Appl. No.: 606,701

[22] Filed: Feb. 26, 1996

[51] Int. Cl.$^6$ .................................................. H05K 1/18
[52] U.S. Cl. .................. 361/736; 361/679; 361/728; 361/752; 174/52.1; 174/52.2; 174/59; 174/61; 439/76.2; 439/946; 439/95
[58] Field of Search .................... 439/76.2, 946, 439/95; 174/52.1, 51, 52.2, 52.3, 59, 61; 361/736, 679, 728, 752, 753, 816, 818

[56] References Cited

U.S. PATENT DOCUMENTS

| | | | |
|---|---|---|---|
| 3,934,074 | 1/1976 | Evelove et al. | 174/52 |
| 4,811,165 | 3/1989 | Currier et al. | 361/386 |
| 5,242,715 | 9/1993 | Schoen et al. | 427/386 |
| 5,381,304 | 1/1995 | Theroux et al. | 361/706 |
| 5,502,620 | 3/1996 | Funck et al. | 361/753 |
| 5,563,770 | 10/1996 | Bethurum | 361/737 |

*Primary Examiner*—Leo P. Picard
*Assistant Examiner*—David Foster
*Attorney, Agent, or Firm*—Mark A. Navarre

[57] ABSTRACT

A die cast housing having an open side receives a circuit which seats on a housing ledge near the open side. An accelerometer and other components carried by the board are enclosed by the housing and board. The outer side of the circuit board is covered with an adhesive sealant compound which secures and seals the circuit board to the housing without fasteners for efficient structural transmissibility, and also structurally dampens the circuit board. A sheet metal cover over the open side inhibits electromagnetic interference. Lateral ports on the housing are aligned with connectors on the circuit board and permit coupling to the circuit board by mating connectors which seal the ports. The connectors have an interference fit with webs on the housing to permit thrust testing before the adhesive sealant is cured.

5 Claims, 2 Drawing Sheets

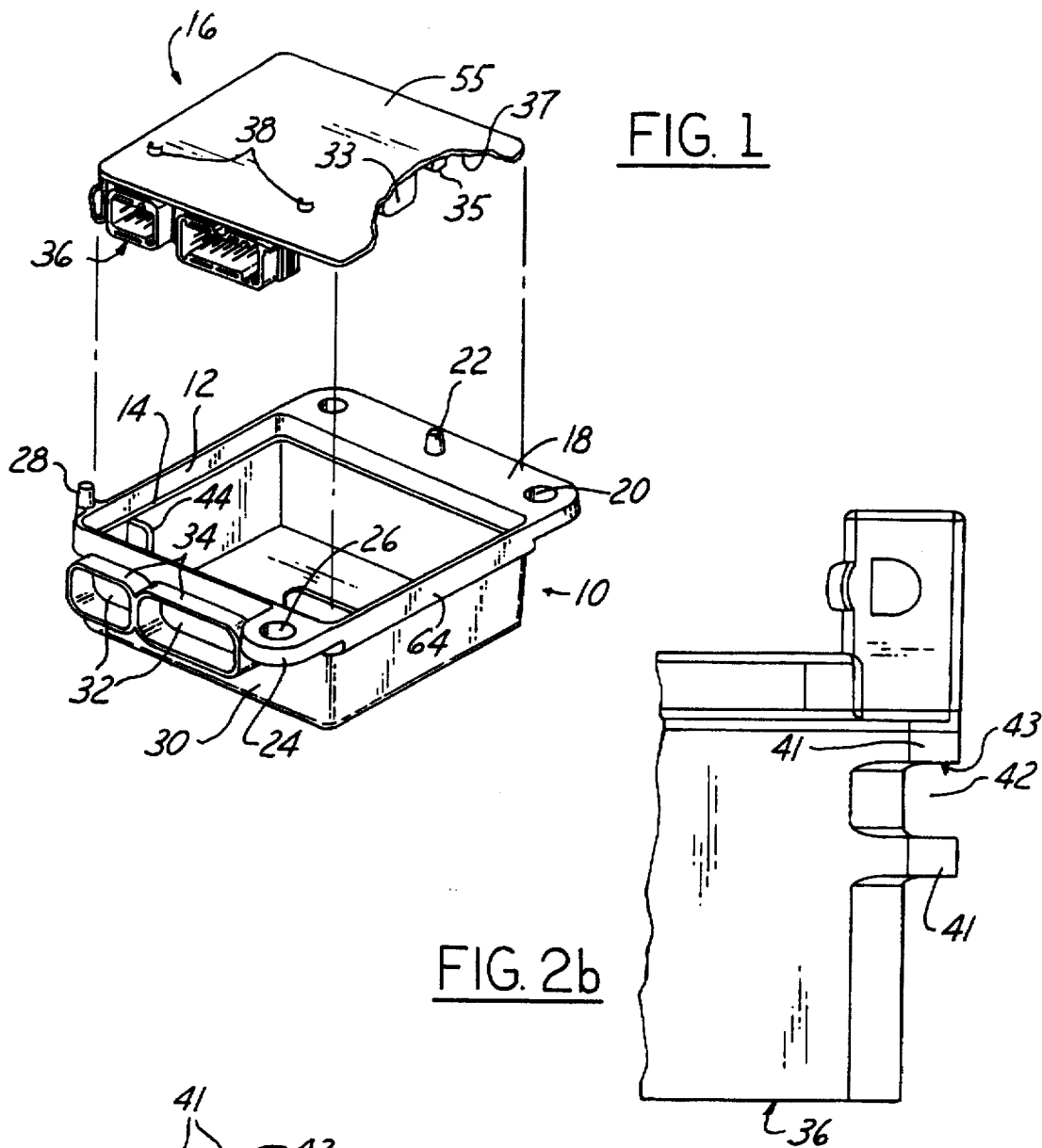
FIG. 1
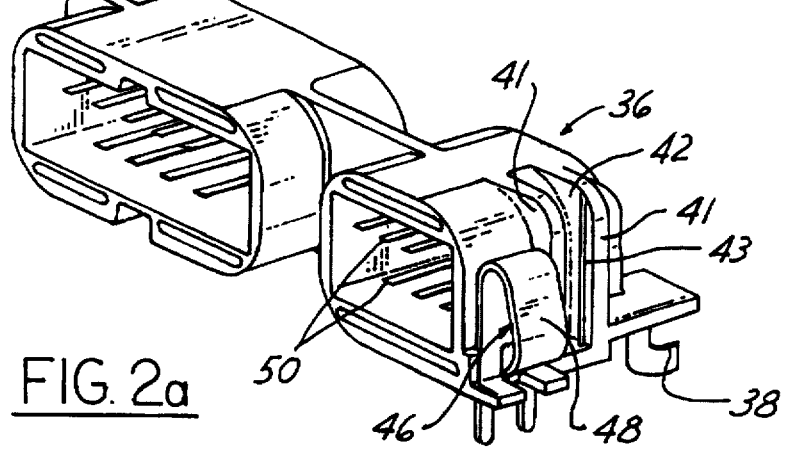
FIG. 2b
FIG. 2a

FASTENERLESS SEALED ELECTRONIC MODULE

FIELD OF THE INVENTION

This invention relates to electronic assemblies and particularly to sealed modules requiring no fasteners for assembly.

BACKGROUND OF THE INVENTION

Airbag or supplemental inflatable restraint systems for automotive vehicles employ a sensing diagnostic module comprising an accelerometer and electronic circuits that are used to detect a vehicle crash and then determine whether the airbag in the vehicle should be deployed. Generally the accelerometer and other circuits are mounted on a single circuit board which is packaged in a protective die cast case. Typically such devices are assembled using selftapping screws. The units are sealed using a "form in place" gasket similar to an "o" ring type gasket. Grounding between the case and the circuit board is achieved via one or more of the screws which connects a ground plane on the circuit board with the case. Typically 3 or 4 screws are require to secure the circuit board to the case and 4 or 5 screws are used to compress the seal between a die cast cover and the case. The disadvantages of this arrangement are: 1) the circuit board is pre-stressed by the screws bearing down on the circuit board, 2) the circuit board is fastened to the case only where the screws are located, 3) the case may be shipped or otherwise handled after the gasket is formed, thereby subjecting the gasket to damage, 4) the screws may provide less than optimum structural dampening of the circuit board, possibly requiring auxiliary dampening mechanisms and/or additional processing of the accelerometer output signal, and 5) due to installing the screws, the assembly of the module is labor intensive.

It is preferred that the stress due to screws be eliminated, that the circuit board be held in place along its entire perimeter, the formed in place gasket be eliminated, the circuit board be structurally dampened, and the assembly labor be minimized. In addition, it is important that tamper deterrent and tamper evident features be employed. Further it is required that the assembly must be watertight, that there will be a structural transmissibility of 1 to 1 between the circuit board and the case, and that the circuit board be grounded, all without the use of fasteners of any type.

SUMMARY OF THE INVENTION

It is therefore an object of the invention to achieve a watertight electronic assembly having a structural transmissibility of 1 to 1 between a circuit board and a case. Another object is to include tamper deterrent and tamper evident mechanisms in such an assembly. Still another object is to achieve these advantages in an assembly without fasteners.

A sensing diagnostic module for an airbag controller has a die cast case or housing with an open side and having a ledge on a wall near the open side for supporting a circuit board. A thick layer of adhesive sealant covers the open side of the circuit board and seals against the housing to form a watertight seal at the interface of the circuit board and the housing and rigidly secures the board in the housing. The sealant layer also affords damping of the circuit board. The other side of the circuit board carries a connector and the housing has a opening aligned with the connector for coupling with an external harness. The opening is surrounded by a collar which makes a sealed coupling with the harness connector. A ground clip on the circuit board connector contacts the housing. An interference fit between the connector and the housing transmits housing motion to the circuit board for thrust testing before the adhesive sealant is completely cured. A sheet metal cover over the open side of the housing protects against electromagnetic interference.

BRIEF DESCRIPTION OF THE DRAWINGS

The above and other advantages of the invention will become more apparent from the following description taken in conjunction with the accompanying drawings wherein like references refer to like parts and wherein:

FIG. 1 is an exploded isometric view of a housing and a circuit board for assembly according to the invention;

FIG. 2a is an isometric view of a circuit board connector of FIG. 1 with a ground clip;

FIG. 2b is a top view of one end of the connector of FIG. 2a;

DESCRIPTION OF THE INVENTION

Figure 3:
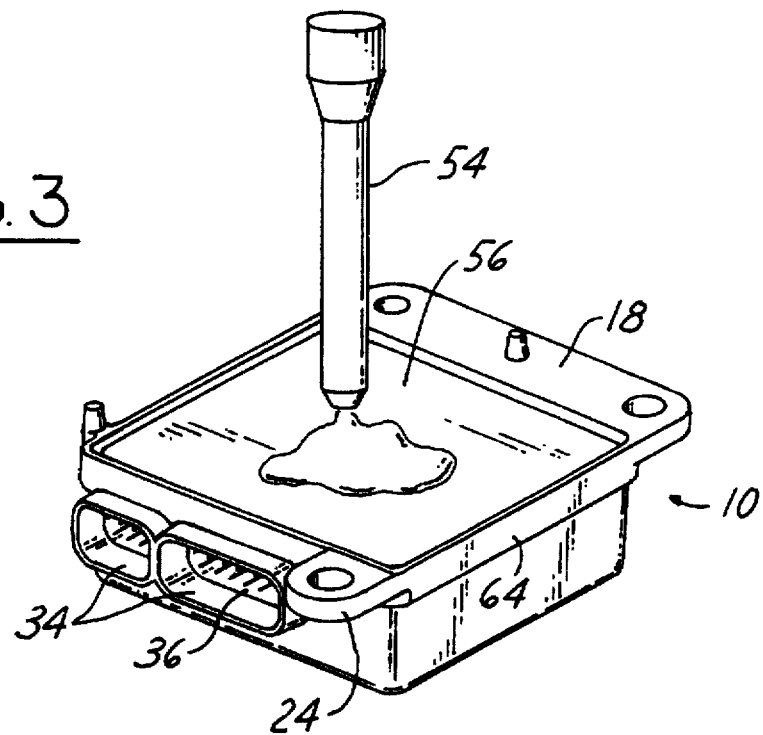
FIG. 3 is an isometric view of a housing and circuit board assembly with sealant being applied to the circuit board.

The ensuing description is directed to a sensing diagnostic module for a supplemental inflatable restraint for use in an automotive vehicle. It will be appreciated, however, that the same principles of construction embodied in the invention are applicable to other electronic modules.

Referring to FIG. 1, a die cast aluminum housing 10 is a generally rectangular shallow box and is open at one side. The inner wall 12 defines a ledge or shelf 14 extending around the housing near the open side to support a circuit board 16. The housing has a rear flange 18 with mounting holes 20 and a locating pin 22, and a front mounting lug 24 with a mounting hole 26. Another locating pin 28 is mounted at one side of the housing. The front face 30 of the housing 10 has a pair of openings 32 to receive harness connectors to be attached to the module. An external collar 34 surrounds each opening 32.

An accelerometer 33 and electronic components 35 are mounted on the inboard surface 37 of the circuit board. A circuit board connector 36 is fastened by snap-in pins 38 to the inboard side of the circuit board. The connector 36 has two sections, each aligned with one of the openings 32. As seen in FIGS. 2a and 2b, the sides of the connector 36 have a pair of vertical slots 42 spaced a fixed distance from the front plane of the connector. Each slot is formed by a pair of spaced flanges 41, and a crushable rib 43 extends inward from one flange toward the other. The housing has short support webs 44 extending inward from the housing wall 12. The webs engage the slots 42 of the connector, when assembled, and hold the connector in position. The ribs 43 interfere with the webs 44 so that during assembly the webs crush the ribs 43 resulting in an interference fit. Due to the interference fit between the webs and the connector, the connector 36 can be precisely located relative to the openings 32 during assembly. When a mating harness connector is coupled to the connector 36, the insertion force is applied to the housing through the webs 44, and not through the circuit board. One end of the connector 36 holds a ground clip 46 which has a spring arm 48 for conductively engaging the inner wall 12 of the housing. The connector 36 has terminal pins 50 which are soldered at one end to respective conductors in the circuit board, and in the same way the ground clip 46 is soldered to a ground plane of the circuit board.

The circuit board 16 is assembled in the housing by a light press which seats the circuit board on the ledge and effects the slight interference fit between the webs 44 and the connector. Then, as shown in FIG. 3, a dispenser 54 applies potting compound 56 over the outboard surface 55 of the circuit board. The potting compound, when applied is in a liquid state and the ledge 14 prevents leakage of the compound into the housing beneath the circuit board. The compound does, however, fill any gap between the circuit board edge and the wall. When cured, the compound then transfers housing movement to the board with a unity transfer function so that the accelerometer senses the acceleration of the housing. A thrust test can be performed on the assembly before the compound is cured because the interference fit between the webs 44 and the connector 36 provides sufficient rigidity for testing an arming sensor on the circuit board.

The compound is an adhesive sealant which seals the interface of the circuit board 16 and the portion of the housing wall 12 above the ledge. The potting compound is preferably a polyurethane two part fast cure adhesive sealant which is applied to a thickness of about 0.125 inch. To assure a fast cure the circuit board and the housing are preheated to 85° C. In about 3 to 5 minutes the compound will gel sufficiently to allow the assembly to be turned over to perform a thrust test on the assembly, and the compound will completely cure in approximately 24 hours. In its liquid form as applied to the assembly, the adhesive sealant has a viscosity of 3000 to 5000 centipoise. The cured compound has a coefficient of thermal expansion of $10^{-5}$ to $10^{-6}$, which is between that of FR-4 circuit board material and the aluminum housing. In the event components are carried on the outboard surface of the circuit board and are thus covered by the compound, a Shore A 40 to 50 hardness of the compound is preferred.

The two part adhesive sealant 56 structurally bonds the board to the case around the entire perimeter of the circuit board without inducing localized stress points to the circuit board and seals the board-housing interface. The layer of adhesive sealant structurally dampens the circuit board to reduce accelerometer noise. The adhesive sealant also is a tamper deterrent and if tampering is attempted damage to the compound will be evident.

Figure 4:
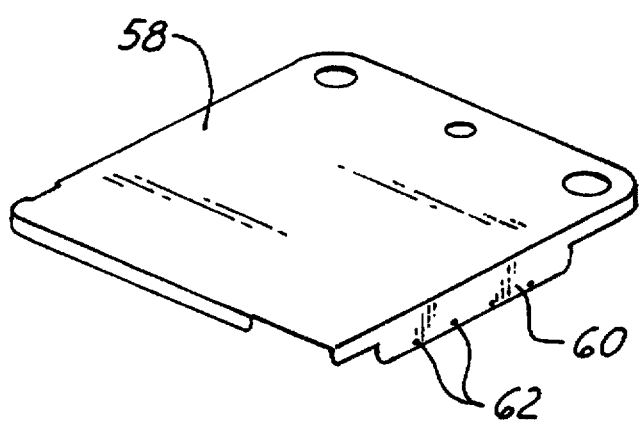
FIG. 4 is a sheet metal cover for the assembly of FIG. 3.

A sheet metal cover 58, shown in FIG. 4, is applied over the open end of the die cast housing 10. The cover has edge flanges 60 with a row of dimples 62 which snap over a rim 64 on the housing outer wall to retain the cover. The cover does not touch the layer of potting compound 56. The purpose of the cover is to provide a shield against electromagnetic interference.

Conventional automotive harness connectors (not shown) are inserted through the collars 24 to couple to the connector 36. Such harness connectors have pliable seals which mate to the inside surfaces of the collars. Thus the assembly is completely sealed when the harness connectors are installed.

It will thus be seen that the sealed module is secured without screws or other fasteners and thus is easier and faster to assemble and eliminates localized stress on the circuit board. The module also has circuit board damping to reduce accelerometer noise. The slight interference fit holds the circuit board in place while the adhesive sealant is applied and allow thrust testing before the adhesive sealant is cured. The interference fit also provides accurate locating of the connector relative to the connector collar to enhance a good seal at the connector collar and takes connector insertion loading off the circuit board.

The embodiments of the invention in which an exclusive property or privilege is claimed are defined as follows:

1. A fastenerless electronic module comprising:

a cast housing having a peripheral wall and a continuous shelf along the wall;

a circuit board seated on the shelf such that an outboard surface of the circuit board is exposed and an inboard surface of said circuit board carrying electronic components faces into the housing, the circuit board having edges seated on the shelf and adjacent the peripheral wall to define an interface of the circuit board and the housing;

a connector mounted on the inboard surface of said circuit board and having ribs that mechanically interlock with web means formed on the peripheral wall of said housing to rigidly couple the connector to the housing and to isolate the circuit board from mechanical stresses applied to the connector; and an adhesive sealant on the outboard side of the circuit board, the adhesive sealant covering the interface of the circuit board and the housing so as to secure the circuit board to the wall and seal the circuit of the circuit board and the housing.

2. The electronic module of claim 1 wherein the electronic components carried by the circuit board include acceleration sensitive components, and the adhesive sealant covers the entire outboard surface of the circuit board so as to structurally dampen the circuit board.

3. The electronic module of claim 1 wherein the electronic components carried by the circuit board include acceleration sensitive components, and the adhesive sealant fills interstices between the circuit board edge and the housing wall to provide structural transmissibility between the wall and the circuit board.

4. A fastenerless electronic module comprising:

a cast housing having a peripheral wall, a shelf along the wall, and inwardly projecting web means;

a circuit board seated on the shelf of the housing, such that an outboard surface of the circuit board is exposed and an inboard surface of said circuit board carrying electronic components faces into the housing, the circuit board having an edge adjacent the peripheral wall to define an interface of the circuit board and the housing;

a connector secured to the inboard surface of the circuit board, said connector having ends defining slots for engaging the web means of the housing;

interference means associated with the slots of said connector for tightly engaging the web means with an interference fit to rigidly couple the circuit board to the housing; and an adhesive sealant on the outboard side of the circuit board at the interface for securing the circuit board to the wall and sealing the interface of the circuit board and the housing.

5. The electronic module of claim 4 wherein a portion of the connector is deformed by the wall upon assembly of the circuit board to the housing.

* * * * *